(12) United States Patent
Cannon et al.

(10) Patent No.: US 7,131,084 B2
(45) Date of Patent: Oct. 31, 2006

(54) METHOD, APPARATUS AND COMPUTER PROGRAM PRODUCT FOR IMPLEMENTING AUTOMATED DETECTION EXCESS AGGRESSOR SHAPE CAPACITANCE COUPLING IN PRINTED CIRCUIT BOARD LAYOUTS

(75) Inventors: Todd Arthur Cannon, Rochester, MN (US); William James Csongradi, Jr., Rochester, MN (US); Roger John Gravrok, Eau Claire, WI (US); Mark Owen Maxson, Mantorville, MN (US); David Lawrence Pease, Rochester, MN (US); Ryan James Schlichting, Rochester, MN (US); Patrick Evarist Sobotta, Stewartville, MN (US)

(73) Assignee: International Business Machines Corporation, Armonk, NY (US)

( * ) Notice: Subject to any disclaimer, the term of this patent is extended or adjusted under 35 U.S.C. 154(b) by 368 days.

(21) Appl. No.: 10/731,064

(22) Filed: Dec. 9, 2003

(65) Prior Publication Data
US 2005/0125752 A1    Jun. 9, 2005

(51) Int. Cl.
    *G06F 9/45*    (2006.01)
(52) U.S. Cl. .................. 716/5; 716/1; 716/2; 716/4; 716/10; 716/15
(58) Field of Classification Search .............. 716/1, 716/2, 4–6, 8–10, 15, 19; 714/26; 703/13, 703/19; 702/58, 65, 183; 438/17; 333/1, 333/12; 324/750; 257/347, 659
See application file for complete search history.

(56) References Cited

U.S. PATENT DOCUMENTS

| | | | | |
|---|---|---|---|---|
| 5,555,506 A | * | 9/1996 | Petschauer et al. | 703/13 |
| 5,596,506 A | * | 1/1997 | Petschauer et al. | 716/5 |
| 5,805,030 A | * | 9/1998 | Dhuey et al. | 333/1 |
| 6,029,117 A | * | 2/2000 | Devgan | 702/58 |
| 6,117,182 A | * | 9/2000 | Alpert et al. | 716/8 |
| 6,323,050 B1 | * | 11/2001 | Dansky et al. | 438/17 |
| 6,449,753 B1 | * | 9/2002 | Aingaran et al. | 716/5 |
| 6,477,694 B1 | * | 11/2002 | Irino et al. | 716/15 |
| 6,536,022 B1 | * | 3/2003 | Aingaran et al. | 716/5 |
| 6,550,037 B1 | * | 4/2003 | Ando et al. | 716/1 |
| 6,604,226 B1 | * | 8/2003 | Thorp et al. | 716/5 |
| 6,615,395 B1 | * | 9/2003 | Hathaway et al. | 716/6 |
| 6,618,845 B1 | * | 9/2003 | Thorp et al. | 716/5 |

(Continued)

*Primary Examiner*—Stacy A. Whitmore
*Assistant Examiner*—Helen Rossoshek
(74) *Attorney, Agent, or Firm*—Joan Pennington

(57) ABSTRACT

A method, apparatus and computer program product are provided for implementing automated detection of excess aggressor shape capacitance coupling in printed circuit board layouts. A PCB design file containing an electronic representation of a printed circuit board design is received. A list of candidate shapes is identified. The candidate shapes are disposed on layers adjacent to aggressor planes. A capacitance coupling the candidate shapes to adjacent aggressor planes is calculated. A ratio of the calculated capacitance and a decoupling capacitance connecting the candidate shapes to a reference plane is determined. The PCB design file containing an electronic representation of a printed circuit board design includes shape data and text data that are extracted to produce a list of shapes' names, areas, locations and planes; and includes data defining thickness and relative permittivity of the dielectric layers used for calculating the effective capacitance is an inter-layer parallel-plate effective capacitance.

14 Claims, 3 Drawing Sheets

U.S. PATENT DOCUMENTS

| | | | |
|---|---|---|---|
| 6,665,845 B1* | 12/2003 | Aingaran et al. | 716/5 |
| 6,694,493 B1* | 2/2004 | Bobba et al. | 716/2 |
| 6,704,919 B1* | 3/2004 | Araki et al. | 716/15 |
| 6,782,347 B1* | 8/2004 | Hirano et al. | 702/183 |
| 6,810,340 B1* | 10/2004 | Shimazaki et al. | 702/65 |
| 6,870,436 B1* | 3/2005 | Grebenkemper | 333/12 |
| 6,983,436 B1* | 1/2006 | Amekawa | 716/5 |
| 7,045,719 B1* | 5/2006 | Alexander et al. | 174/262 |
| 2002/0065643 A1* | 5/2002 | Hirano et al. | 703/19 |
| 2002/0169590 A1* | 11/2002 | Smith et al. | 703/18 |
| 2003/0065498 A1* | 4/2003 | Bois et al. | 703/19 |
| 2004/0015737 A1* | 1/2004 | Martin et al. | 714/26 |
| 2004/0145033 A1* | 7/2004 | McElvain | 257/659 |
| 2004/0230926 A1* | 11/2004 | Berry et al. | 716/5 |
| 2005/0060675 A1* | 3/2005 | Tetelbaum | 716/5 |
| 2005/0108671 A1* | 5/2005 | Becker et al. | 716/10 |

* cited by examiner

METHOD, APPARATUS AND COMPUTER PROGRAM PRODUCT FOR IMPLEMENTING AUTOMATED DETECTION EXCESS AGGRESSOR SHAPE CAPACITANCE COUPLING IN PRINTED CIRCUIT BOARD LAYOUTS

FIELD OF THE INVENTION

The present invention relates generally to the electronic design automation field, and more particularly, relates to a method, apparatus and computer program product for implementing automated detection of excess aggressor shape capacitance coupling in printed circuit board layouts.

DESCRIPTION OF THE RELATED ART

As used in the present specification and claims, the term printed circuit board or PCB means a substrate or multiple layers (multi-layer) of substrates used to electrically attach electrical components and should be understood to generally include circuit cards, printed circuit cards, backplanes, printed wiring cards, printed wiring boards, flex circuits, and ceramic or organic chip packaging substrates.

In the layout of printed circuit boards typically including multiple layers or planes, a significant problem results from undetected capacitive coupling of electrical noise between an aggressor power plane or shape that generates noise and a victim shape that receives noise. A shape can be defined as a width or area of copper on a printed circuit board, potentially smaller than adjacent planes on the card, often used for power distribution or noise isolation.

Noise coupling can occur between any two shapes or planes that have overlapping areas.

Decoupling capacitors can be employed to significantly reduce the noise on the victim shapes by coupling their voltage to a more stable reference, such as ground, but the vulnerable power shapes must first be detected. If left undetected and uncorrected, noise on these shapes can cause significant circuit malfunctions, and possibly undesired electromagnetic emissions, necessitating a redesign of the board, and resulting in project delays, schedule slips, and lost revenue.

The current method employed to detect these susceptible shapes is to manually (visually) examine an electronic representation of the circuit card layout in order to locate such shapes. This process is very time consuming, tedious, and prone to manual errors such as overlooking possible vulnerable shapes, or flagging shapes that should not be decoupled, such as signals.

A need exists for an effective mechanism for implementing automated detection of excess aggressor shape capacitance coupling in printed circuit board layouts.

SUMMARY OF THE INVENTION

A principal object of the present invention is to provide a method, apparatus and computer program product for implementing automated detection of excess aggressor shape capacitance coupling in printed circuit board layouts. Other important objects of the present invention are to provide such method, apparatus and computer program product for implementing automated detection of excess aggressor shape capacitance coupling in printed circuit board layouts substantially without negative effect and that overcome many of the disadvantages of prior art arrangements.

In brief, a method, apparatus and computer program product are provided for implementing automated detection of excess aggressor shape capacitance coupling in printed circuit board layouts. A PCB design file containing an electronic representation of a printed circuit board design is received. A list of candidate shapes is identified. The candidate shapes are disposed on layers adjacent to power planes. An effective capacitance coupling the candidate shapes to adjacent noise-generating voltage planes is calculated. A ratio of the calculated effective capacitance and a decoupling capacitance connecting the candidate shapes to a reference plane is determined.

In accordance with features of the invention, the PCB design file containing an electronic representation of a printed circuit board design includes shape data and text data that are extracted to produce a list of shapes' names, areas, locations and planes; and includes data defining thickness and a relative permittivity of the dielectric layers. The candidate shapes have an assigned name that indicates usage. The calculated effective capacitance is an inter-layer parallel-plate effective capacitance represented by:

$$Cpp=eA/D$$

Where,
$A$=Plane and candidate shape overlap area (Meter$^2$)
$e=er*eo$, where $er$ represents relative permittivity
$eo$ equals $8.854 \times 10\textasciicircum-12$ Farads/Meter; (permittivity of free space)
$D$=the distance (Meters) between the candidate shape and the adjacent plane.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
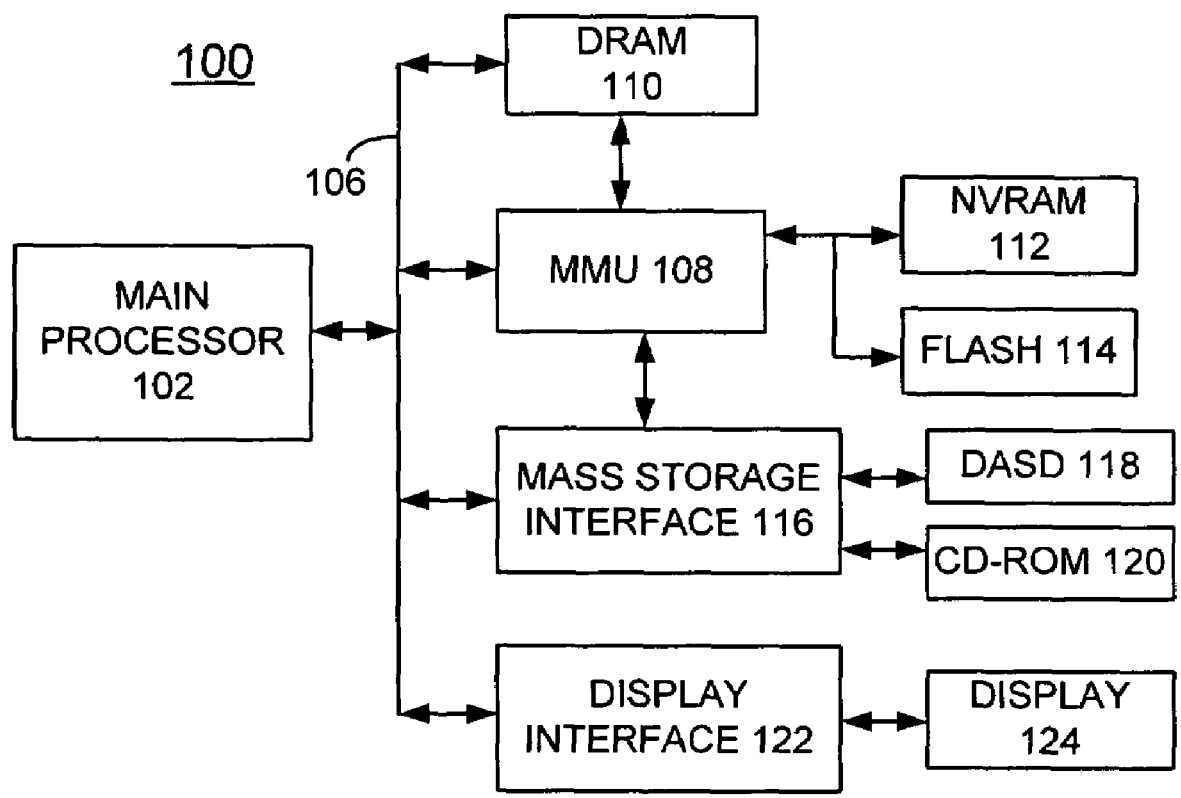
FIGS. 1 and 2 are block diagram representations illustrating a computer system and operating system for implementing methods for implementing automated detection of excess aggressor shape capacitance coupling in printed circuit board layouts in accordance with the preferred embodiment.
Figure 2:
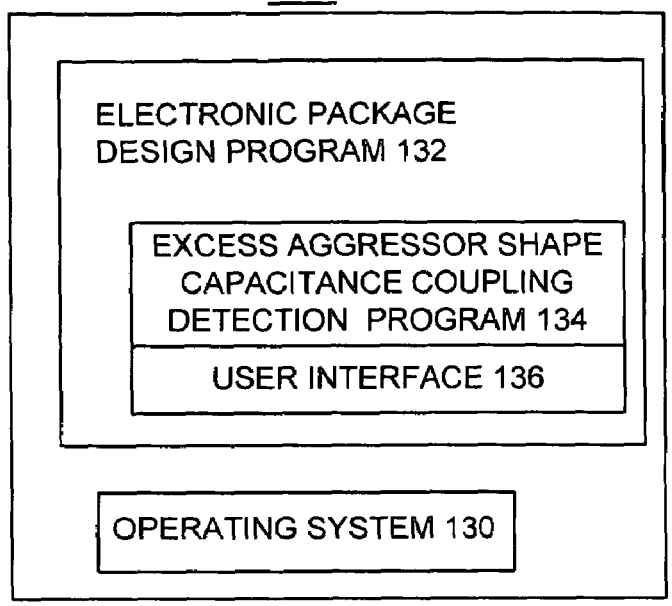

Referring now to the drawings, in FIGS. 1 and 2 there is shown a computer system generally designated by the reference character 100 for implementing automated detection of excess aggressor shape capacitance coupling in printed circuit board layouts in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

As shown in FIG. 2, computer system 100 includes an operating system 130, an electronic package design program 132, an excess aggressor shape capacitance coupling detection program 134 of the preferred embodiment, and a user interface 136 for displaying identified lists of candidate shapes for user review.

In accordance with features of the preferred embodiment, a method is provided that rapidly and accurately screens original design data that represents a circuit board under examination. Through the excess aggressor shape capacitance coupling detection program 134, the locations of possible vulnerable or candidate shapes are determined. The effective capacitance coupling the possible vulnerable shapes to adjacent noise-generating planes is calculated. It is then determined if sufficient coupling exists between the victim shapes and an adjacent reference plane. The advantages of this method include greatly increased speed, accuracy, and repeatability in the examination of the design for vulnerable shapes. Automating the process of examining the design data file for these shapes eliminates the possibility of manual errors through oversights or application of incorrect screening criteria.

Figure 3:
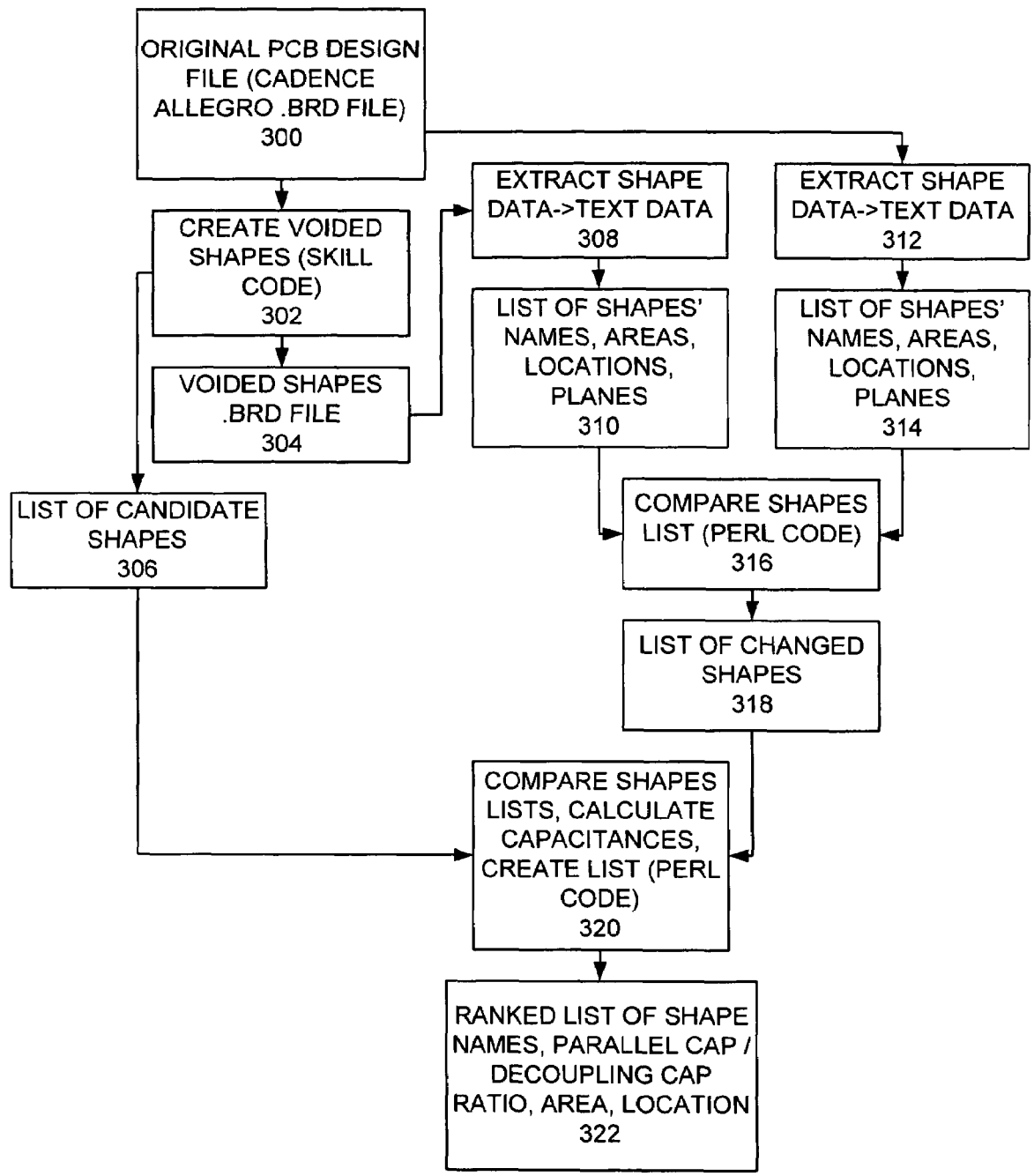
FIG. 3 is a flow chart illustrating exemplary steps for implementing automated detection of excess aggressor shape capacitance coupling in printed circuit board layouts in accordance with the preferred embodiment.

Referring now to FIG. 3, there are shown exemplary steps for implementing automated detection of excess aggressor shape capacitance coupling in printed circuit board layouts in accordance with the preferred embodiment. An original PCB design file containing an electronic representation of a printed circuit board design is received as indicated in a block 300. The original PCB design file is, for example, a Cadence Allegro board (.brd) file, where Allegro is the computer-aided printed circuit board design software sold by Cadence Design Systems, Inc.

The original PCB design file is manipulated via the excess aggressor shape capacitance coupling detection program 134 to create voided shapes as indicated in a block 302, for example, implemented in SKILL code. The voided shapes represent the areas of the noise-generating shapes with the overlapping areas of adjacent plane vulnerable shapes geometrically subtracted (voided) from the potential noise-generating shapes. A voided shapes PCB file is generated as indicated in a block 304 and a list of candidate voltage shapes is produced from the voided shapes as indicated in a block 306. Known Cadence layout tools support the SKILL language, for example, used at block 302. The list of candidate voltage shapes produced at block 306 are shapes that lie on layers adjacent to power planes and have an assigned name that indicates their usage possibly for power distribution, for example, such as VddA, V1.5, and the like.

From the voided shapes PCB file generated at block 304, shape data and text data are extracted as indicated in a block 308. A list of shapes' names, areas, locations, and planes is generated as indicated in a block 310.

Similarly from the original PCB design file received at block 300, shape data and text data are extracted as indicated in a block 312. A list of shapes' names, areas, locations, and planes is generated as indicated in a block 314.

Then the shapes lists generated at block 310 and 314 are compared, for example, using practical extension and report language (PERL) code as indicated in a block 316. A list of changed shapes is generated as indicated in a block 318. This list includes the area differences between the original noise-generating planes at block 314, and the voided versions of these shapes at block 310 and thus allows overlap area and capacitance calculations to be performed.

Then the list of candidate shapes generated at block 306 and the list of changed shapes generated at block 318 are compared, the effective capacitance coupling the possible vulnerable shapes to adjacent noise-generating voltage planes is calculated, and a list is created, for example, using PERL code as indicated in a block 320. Next a determination is made if sufficient capacitance coupling of identified possible vulnerable candidate shapes to a reference plane is present that includes creating a ranked list of shape names, a ratio of parallel capacitance to decoupling capacitance, an area, and a location as indicated in a block 322.

The excess aggressor shape capacitance coupling detection program 134 uses this list of candidate shapes at block 306 and at block 320 calculates the overlapping area between these shapes, and possible adjacent aggressor power shapes or planes. The resulting list of overlap areas together with the thickness and permittivity (er) of the dielectric layers, also contained in the .brd file received at block 300, are used to calculate effective inter-layer parallel-plate capacitance at block 320, represented by the following formula:

$$Cpp = eA/D$$

Where,

A=Plane and candidate shape overlap area (Meter$^2$)

e=er*eo, where er represents relative permittivity eo equals $8.854 \times 10^{-12}$ Farads/Meter; (permittivity of free space)

D=the distance (Meters) between the candidate shape and the adjacent plane.

The value of Cpp will then be compared to the amount of decoupling capacitance connected from the shape to a reference plane; the ratios of these two numbers will be sorted and listed for user review, along with shape net names and coordinates in the ranked list of shape names at block 322.

Figure 4:
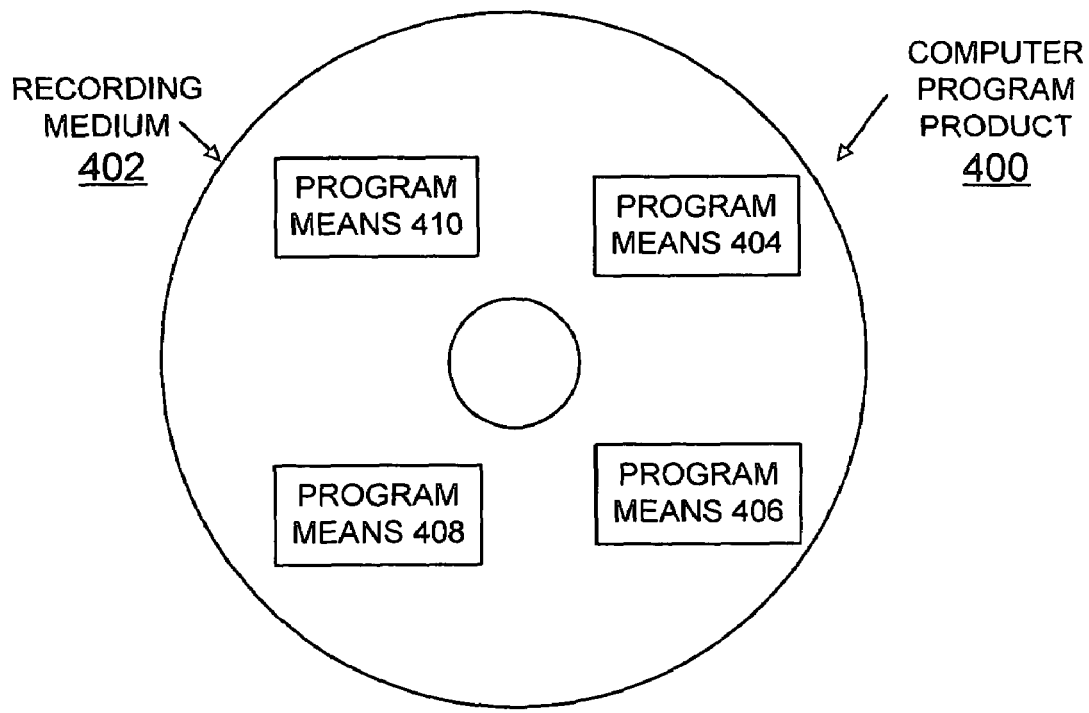
FIG. 4 is a block diagram illustrating a computer program product in accordance with the preferred embodiment.

Referring now to FIG. 4, an article of manufacture or a computer program product 400 of the invention is illustrated. The computer program product 400 includes a recording medium 402, such as, a floppy disk, a high capacity read only memory in the form of an optically read compact disk or CD-ROM, a tape, a transmission type media such as a digital or analog communications link, or a similar computer program product. Recording medium 402 stores program means 404, 406, 408, 410 on the medium 402 for carrying out the methods for implementing automated detection of excess aggressor shape capacitance coupling in printed circuit board layouts of the preferred embodiment in the system 100 of FIGS. 1 and 2.

A sequence of program instructions or a logical assembly of one or more interrelated modules defined by the recorded program means 404, 406, 408, 410, direct the computer system 100 for implementing automated detection of excess aggressor shape capacitance coupling in printed circuit board layouts of the preferred embodiment.

While the present invention has been described with reference to the details of the embodiments of the invention shown in the drawing, these details are not intended to limit the scope of the invention as claimed in the appended claims.

What is claimed is:

1. A method for implementing automated detection of excess aggressor shape capacitance coupling in printed circuit board (POB) layouts comprising the steps of:
    receiving a PCB design file containing an electronic representation of a printed circuit board design;
    identifying a list of candidate shapes, said candidate shapes disposed on layers adjacent to power planes;
    calculating an effective capacitance coupling the candidate shapes to adjacent noise-generating planes including identifying an overlap area of the candidate shapes to each adjacent noise-generating plane; and
    determining a ratio of each said calculated coupling capacitance and a decoupling capacitance connecting the respective candidate shape to a reference plane.

2. The method for implementing automated detection of excess aggressor shape capacitance coupling as recited in claim 1 includes the step of sorting said determined ratios and providing a ranked list of shape names using said sorted ratios.

3. The method for implementing automated detection of excess aggressor shape capacitance coupling as recited in claim 2 wherein the step of providing said ranked list of shape names includes providing said ranked list of shape names with said determined ratio, an area, and a location of said shapes.

4. A The method for implementing automated detection of excess aggressor shape capacitance coupling as recited in claim 1 wherein the step of identifying said list of candidate shapes includes identifying said candidate shapes disposed on layers adjacent to power planes and having an assigned name that indicates usage for power distribution.

5. The method for implementing automated detection of excess aggressor shape capacitance coupling as recited in claim 1 includes the step of identifying data from said received PCB design file representing a distance between the candidate shapes and said adjacent noise-generating planes and permittivity of the dielectric layers.

6. The method for implementing automated detection of excess aggressor shape capacitance coupling as recited in claim 1 wherein said determined ratio of each said calculated effective capacitance and said decoupling capacitance connecting the respective candidate shape to a reference plane is used to produce a ranked list of the candidate shapes for user review.

7. A method for implementing automated detection of excess aggressor shape capacitance coupling in printed circuit board (PCB) layouts comprising the steps of:
    receiving a PCB design file containing an electronic representation of a printed circuit board design;
    identifying a list of candidate shapes, said candidate shapes disposed on layers adjacent to power planes;
    calculating an effective capacitance coupling the candidate shapes to adjacent noise-generating planes including calculating an inter-layer parallel-plate effective capacitance represented by:

$$Cpp = eA/D$$

where,
    A=Plane and candidate shape overlap area (Meter$^2$)
    e=er*eo, where er represents relative permittivity
    eo equals a predefined constant value Farads/Meter; (permittivity of free space)
    D=the distance (Meters) between the candidate shape and the adjacent plane; and
    determining a ratio of each said calculated coupling capacitance and a decoupling capacitance connecting the respective candidate shape to a reference plane.

8. A computer program product for implementing automated detection in a computer system of excess aggressor shape capacitance coupling in printed circuit board (PCB) layouts, said computer program product including instructions executed by the computer system to cause the computer system to perform the steps of:
    receiving a PCB design file containing an electronic representation of a printed circuit board design;
    identifying a list of candidate shapes, said candidate shapes disposed on layers adjacent to power planes;
    calculating said effective capacitance coupling the candidate shapes to adjacent noise-generating planes includes the steps of calculating an inter-layer parallel-plate effective capacitance represented by:

$$Cpp = eA/D$$

where,
    A=Plane and candidate shape overlap area (Meter$^2$)
    e=er*eo, where er represents relative permittivity
    eo equals a predefined constant value Farads/Meter; (permittivity of free space)
    D=the distance (Meters) between the candidate shape and the adjacent plane; and
    determining a ratio of each said calculated effective capacitance and a decoupling capacitance connecting the respective candidate shape to a reference plane.

9. The computer program product for implementing automated detection as recited in claim 8 includes the steps of sorting said determined ratios and providing a ranked list of shapes including a shape name, said ratio, an area, and a location.

10. The computer program product for implementing automated detection as recited in claim 8 wherein the step of identifying said list of candidate shapes includes identifying said candidate shapes having a predefined assigned name indicating usage.

11. The computer program product for implementing automated detection as recited in claim 8 includes the step of using said determined ratio of each said calculated effective capacitance and said decoupling capacitance connecting the respective candidate shape to a reference plane to produce a ranked list of the candidate shapes for user review.

12. An apparatus for implementing automated detection of excess shape coupling in printed circuit board (PCB) layouts comprising:
    an excess shape coupling detection program for receiving a PCB design file containing an electronic representation of a printed circuit board design; for using said POB design file for identifying a list of candidate shapes, said candidate shapes disposed on layers adjacent to aggressor planes; for calculating an effective capacitance coupling the candidate shapes to adjacent noise-generating planes including identifying an overlap area of the candidate shapes to each adjacent noise-generating plane and including calculating an inter-layer parallel-plate effective capacitance represented by:

$$Cpp = eA/D$$

where,
    A=Plane and candidate shape overlap area (Meter$^2$)

e=er*eo, where er represents relative permittivity eo equals a predefined constant value Farads/Meter; (permittivity of free space)

D=the distance (Meters) between the candidate shape and the adjacent plane; for determining a ratio of each said calculated effective capacitance and a decoupling capacitance connecting the respective candidate shape to a reference plane; for sorting said determined ratios to produce a ranked list of the candidate shapes; and a user interface for displaying said ranked list of the candidate shapes for user review.

13. The apparatus for implementing automated detection of excess shape coupling as recited in claim 12 wherein said ranked list of the candidate shapes includes shape names with said determined ratio, an area, and a location of the candidate shapes.

14. The apparatus for implementing automated detection of excess shape coupling as recited in claim 12 wherein each said candidate shape has a predefined assigned name indicating usage.

* * * * *